United States Patent [19]

Nakano et al.

[11] Patent Number: 5,662,743
[45] Date of Patent: Sep. 2, 1997

[54] METHOD OF CLEANING SILICON WAFERS IN CLEANING BATHS WITH CONTROLLED VERTICAL SURFACE OSCILLATIONS AND CONTROLLED IN/OUT SPEEDS

[75] Inventors: Masami Nakano; Isao Uchiyama; Hiroyuki Takamatsu; Morie Suzuki, all of Fukushima-ken, Japan

[73] Assignee: Shin-Etsu Handotai Co., Ltd., Tokyo, Japan

[21] Appl. No.: 439,560

[22] Filed: May 11, 1995

[30] Foreign Application Priority Data

May 19, 1994 [JP] Japan .................. 6-105116

[51] Int. Cl.⁶ .................. B08B 3/04; C23G 1/02
[52] U.S. Cl. .................. 134/3; 134/32; 134/34
[58] Field of Search .................. 134/2, 3, 25.4, 134/25.5, 32, 34

[56] References Cited

U.S. PATENT DOCUMENTS

| | | | |
|---|---|---|---|
| 5,071,488 | 12/1991 | Takayama et al. | 134/34 |
| 5,158,616 | 10/1992 | Kinoshita et al. | 134/32 X |
| 5,277,715 | 1/1994 | Cathey | 134/3 X |
| 5,346,556 | 9/1994 | Perry et al. | 134/2 |
| 5,372,651 | 12/1994 | Kodama | 134/2 X |
| 5,382,296 | 1/1995 | Anttila | 134/3 |
| 5,415,698 | 5/1995 | Fujinaga et al. | 134/3 X |

OTHER PUBLICATIONS

*Journal of the Electrochemical Society*, vol. 137, No. 10, Oct. 1, 1990, Akihiro Miyauchi et al. "Low-Temperature (900°C) Si Epitaxial Growth on Si (100) after HF Treatment"; pp. 3257-3260.

*Primary Examiner*—Jill Warden
*Assistant Examiner*—Saeed Chaudhry
*Attorney, Agent, or Firm*—Barnes & Thornburg

[57] ABSTRACT

A novel HF cleaning method of silicon wafers is provided whereby the wafers are cleaned with a lowered level of particle contamination on the surface thereof. In the method silicon wafers are immersed in a HF bath, followed by immersion in a deionized water bath. The silicon wafers are lowered into and lifted out of each bath along a direction which is substantially vertical with respect to a surface of each bath at a rate of from 1 mm/sec to 50 mm/sec. During immersion, a vertical oscillation of the surface of each bath is maintained in the range of less than 4 mm.

9 Claims, 3 Drawing Sheets

INFLUENCE OF TAKEN-IN-OR-OUT SPEED IN HF BATH AND DEIONIZED WATER BATH ON PARTICLE LEVEL OF WAFER SURFACE AS CLEANED AT VERTICAL OSCILLATION OF LIQUID SURFACE : 2mm

INFLUENCE OF TAKEN-IN-OR-OUT SPEED IN HF BATH AND DEIONIZED WATER BATH ON PARTICLE LEVEL OF WAFER SURFACE AS CLEANED AT VERTICAL OSCILLATION OF LIQUID SURFACE : 2mm

INFLUENCE OF VERTICAL OSCILLATION OF LIQUID SURFACE IN HF BATH AND DEIONIZED WATER BATH ON PARTICLE LEVEL OF WAFER SURFACE AS CLEANED AT WAFER TAKEN - IN - OR - OUT SPEED : 10mm/sec INFLUENCE OF TAKEN-IN-OR-OUT SPEED IN HF BATH AND DEIONIZED WATER BATH ON PARTICLE LEVEL OF WAFER SURFACE AS CLEANED AT VERTICAL OSCILLATION OF LIQUID SURFACE : 8mm

METHOD OF CLEANING SILICON WAFERS IN CLEANING BATHS WITH CONTROLLED VERTICAL SURFACE OSCILLATIONS AND CONTROLLED IN/OUT SPEEDS

BACKGROUND OF THE INVENTION

1. Field of the Invention

The present invention relates to improvement in the traditional HF cleaning method of silicon wafers (hereafter simply referred to as wafer).

2. Description of the Prior Art

The traditional HF (hydrofluorid acid) cleaning was well used in a cleaning process due to its high ability to remove metallic ions on the surface of a wafer. However, it has a problem that wafers are easily subject to particle contamination in an operation of its own and thus the cleaning in an aqueous solution of hydrochloric acid and hydrogen peroxide combined is preferred when particle contamination is to be avoided. Particles on a wafer cause such a disadvantage that, in optical exposure by a stepping projection aligner in fabrication of electronic devices, the particles intercept light beam through the windows in a mask to make shadows on a photoresist layer, which results in much of decrease in device production yield due to occurrence of defective interconnections directly related to the shadows or poor local exposure. What's more, under the recent trend towards more highly packed devices in a silicon IC chip, the level down of metallic ion presence on a wafer has been increasingly required, which naturally calls for introduction of a new improved HF cleaning with the intrinsic nature of less particle contamination thereof.

The inventors have continued in-depth research on decrease in particle contamination of the HF cleaning of wafers and found that it is important for decrease in particle contamination of wafers in an HF cleaning how to take them in or out a hydrofluoric acid bath (hereinafter referred to as HF bath) and a deionized water bath for rinsing the wafers, which is the clue from which the present invention has been made.

SUMMARY OF THE INVENTION

It is an object of the present invention to provide a novel HF cleaning method of wafers, wherein particle contamination of the wafers is greatly decreased.

According to the present invention, silicon wafers are taken in or out an HF bath and a deionized water bath for rinsing the wafers at a speed from 1 mm/sec to 50 mm/sec, while the vertical oscillations of the liquid surfaces in the baths are both controlled under 4 mm, whereby the problem on particle contamination is solved.

The above mentioned taken-in-or-out speed is preferably in the range from 1 mm/sec to 20 mm/sec and more preferably in the range from 5 mm/sec to 20 mm/sec.

The above mentioned vertical oscillation each of the HF bath and the deionized water bath is preferably in the range under 2 mm and more preferably in the range under 1 mm.

The decreasing effect of particle contamination of wafers is disappeared not only when the taken-in-or-out speed of a silicon wafer is beyond the highest upper limit above mentioned, but also when the vertical oscillation of either the liquid surface of the HF bath of that of the deionized water bath is beyond the highest upper limit.

On the other hand, it is not preferable since the working efficiency in a cleaning process is deteriorated, that the taken-in-or-out speed of a silicon wafer is selected lower than the lowest lower limit. The vertical oscillation of the liquid surface each is preferably selected to be less than the lowest of the upper limits.

BRIEF DESCRIPTION OF THE DRAWINGS

The novel features which are considered characteristic of the present invention are set forth particularly in the appended claims. However, the present invention itself and additional objects and advantages thereof will be best understood from the following description of embodiments thereof when read in connection with the accompanying drawings, in which:

DETAILED DESCRIPTION OF THE PREFERRED EMBODIMENTS

Hereinafter, preferred embodiments according to the present invention will be illustratively explained in reference to the accompanying drawings.

Experiment (1)

Silicon wafer: CZ, p type, 200 mm in diameter, Crystallographic direction of the surface: <100>; HF bath: 320 mm×30 mm×280 mm in size, Concentration of HF aqueous solution: 0.5%; Deionized water bath: 320 mm×30 mm×280 mm in size; and Dipping duration: 3 min. Taken-in-or-out speeds in the HF bath and the deionized water bath were selected to be 5 mm/sec, 10 mm/sec, 20 mm/sec, 40 mm/sec, 60 mm/sec, 80 mm/sec, 100 mm/sec and 140 mm/sec, where each speed was applied to both baths at a time. The postures of the wafers were so controlled for both the main surfaces each to be almost vertical relative to the liquid surface each when the each of the wafers was taken in or out the liquid in any of both the baths. A vertical oscillation of both the HF bath and the deionized water bath was regulated to be a constant value of 2 mm.

Nine of the silicon wafers were respectively tested in Experiment (1) according to the nine experimental conditions, where the nine wafers were all processed through the HF cleaning and rinsing in the deionized water, which directly followed the former.

Figure 1:
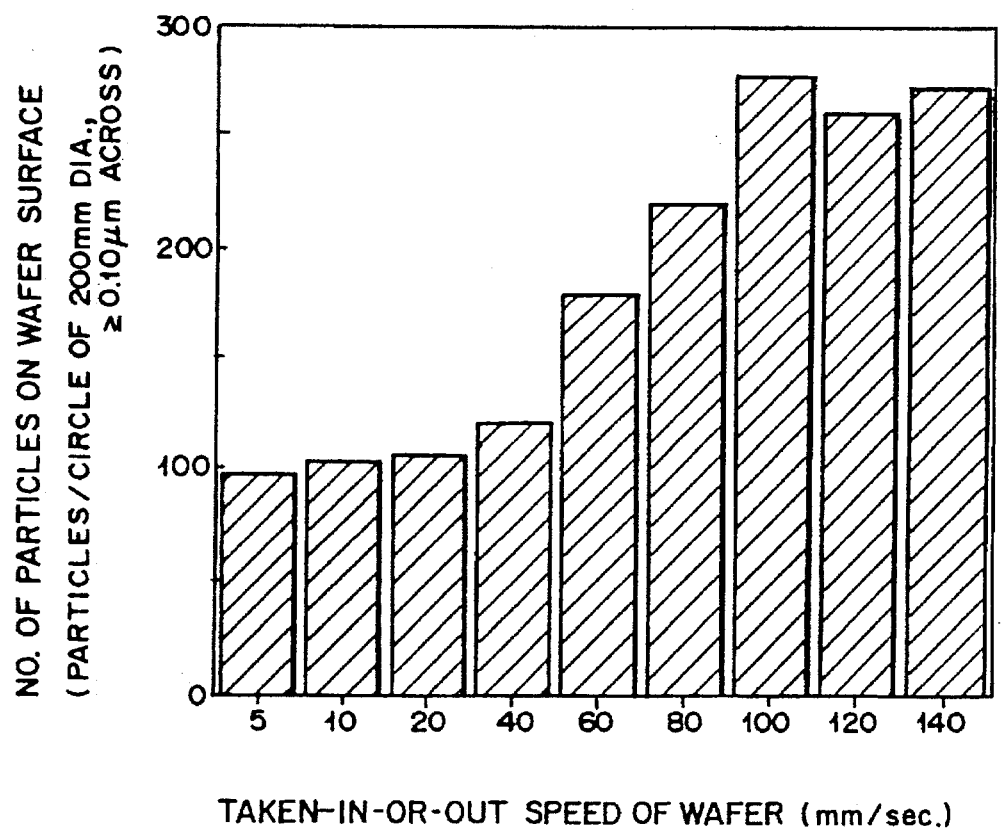
FIG. 1 is a bar graph showing a relation between taken-in-or-out speeds of wafers and observed particle counts on the wafers in Experiment (1)

Particles on the polished surface each of the wafers as cleaned in the HF cleaning were counted with Laser Particle Counter LS-6000 (made by Hitachi Electronics Engineering Co.) in terms of numbers of the particles of larger than 0.1 µm across per a circle of 200 mm in diameter and the results are shown in FIG. 1. Measurement of the vertical oscillation of the liquid surface each of the baths was carried out with Ultrasonic Displacement Sensor UD-1100 (made by keyence Co.)

As clearly shown in FIG. 1, which is the case of a vertical oscillation of the liquid surface of 2 mm, level of particle contamination on a wafer is confirmed to have been decreased below half of the traditional level from 200 to 500 counts/a circle of 200 mm in diameter at a taken-in-or-out speed of a wafer lower than 40 mm/sec.

Experiment (2)

Silicon wafer: CZ, p type, 200 mm in diameter, Crystallographic direction of the surface: <100>; HF bath: 320 mm×30 mm×280 mm in size, Concentration of HF aqueous solution: 0.5%; Deionized water bath: 320 mm×30 mm×280 mm in size; and Dipping duration: 3 min. A taken-in-or-out speeds in the HF bath and the deionized water bath was selected to be a constant value of 10 mm/sec. The postures of the wafers were so controlled for both the main surfaces each to be almost vertical relative to the liquid surface each when each of the wafers was taken in or out the liquid in any of both the baths. Vertical oscillations each of both the HF bath and deionized water bath was regulated to be 1, 2, 4, 6, 8 and 10 mm, where each value of the vertical oscillations was applied to the both baths at a time.

Six of the silicon wafers were respectively tested in Experiment (2) according to the above six experimental conditions, where the six wafers were all through the HF cleaning and rinsing in the deionized water, which directly followed the former.

Figure 2:
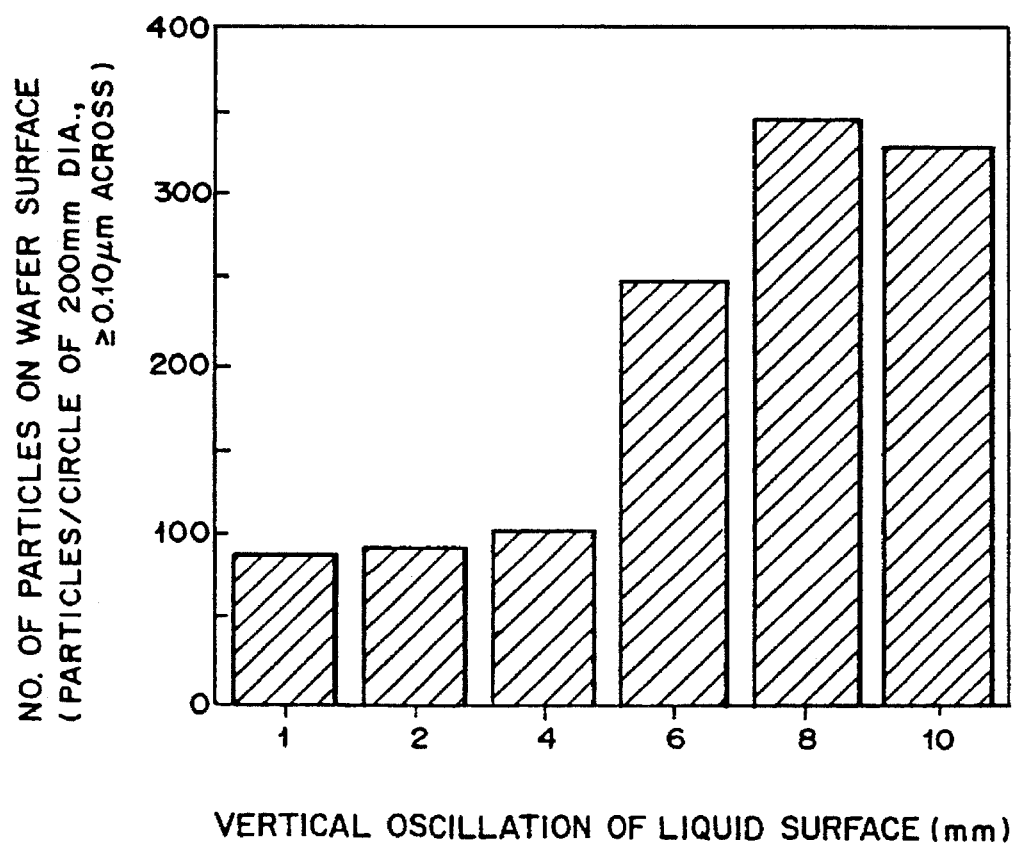
FIG. 2 is a bar graph showing a relation between common vertical oscillations of the liquid surfaces in both an HF bath and a deionized water bath for rinsing and observed particle counts on the wafers in Experiment (2)

Particles on the polished surface each of the wafers as cleaned in the HF cleaning were counted in the same way as in Experiment (1) and the results are shown in FIG. 2.

As clearly shown in FIG. 2, which is the case of a taken-in-or-out speed of a wafer of 10 mm/sec, level of particle contamination on a wafer is confirmed to have been decreased below half of the traditional level from 200 to 500 counts/a circle of 200 mm in diameter at a vertical oscillation of the liquid surface lower than 4 mm.

Experiment (3)

Silicon wafer: CZ, p type, 200 mm in diameter, Crystallographic direction of the surface: <100>; HF bath: 320 mm×30 mm×280 mm in size, Concentration of HF aqueous solution: 0.5%; Deionized water bath: 320 mm×30 mm×280 mm in size; and Dipping duration: 3 min. Taken-in-or-out speeds in the HF bath and the deionized water bath were selected to be 5, 10, 20, 40, 60, 80, 100, 120 and 140 mm/sec. The postures of the wafers were so controlled for both the main surfaces each to be almost vertical relative to the liquid surface each when each of the wafers was taken in or out the liquid in any of both the baths. A vertical oscillation of both the HF bath and deionized water bath was regulated to be a constant value of 8 mm.

Nine of the silicon wafers were respectively tested in Experiment (3) according to the above nine experimental conditions, where the nine wafers were all through the HF cleaning and rinsing in the deionized water, which directly followed the former.

Figure 3:
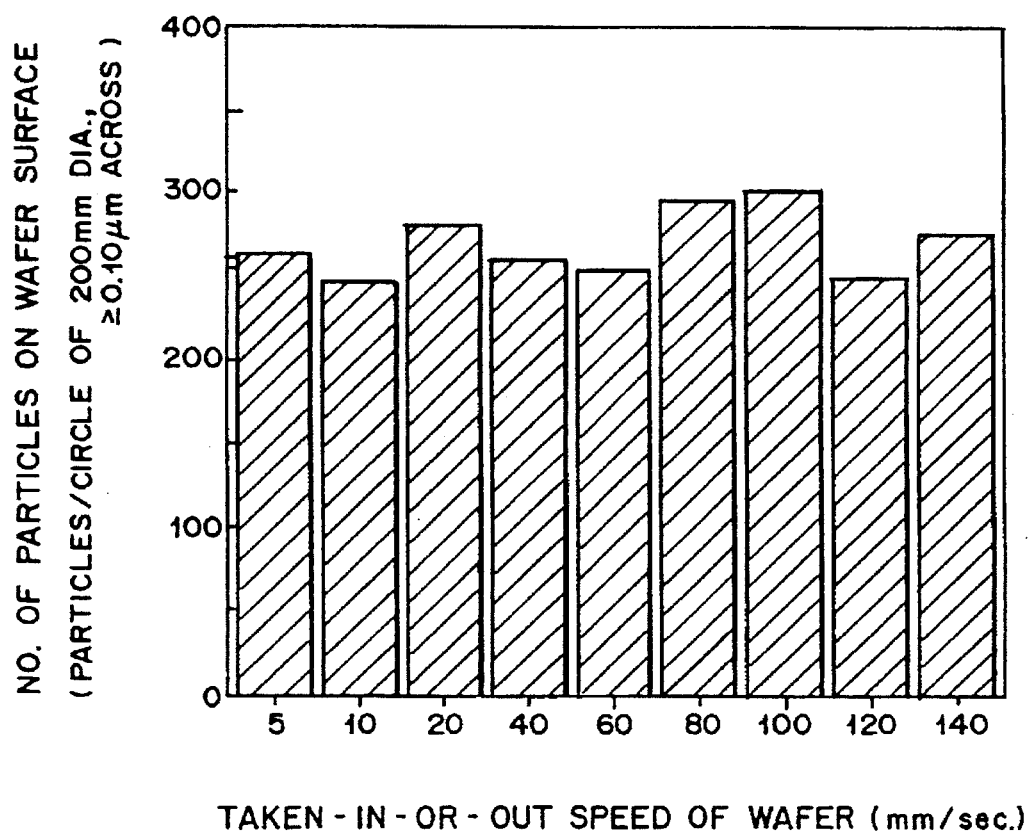
FIG. 3 is a bar graph showing a relation between taken-in-or-out speeds of wafers and observed particle counts on the wafers in Experiment (3).

Particles on the polished surface each of the wafers as cleaned in the HF cleaning were counted in the same way as in Experiment (1) and the results are shown in FIG. 3.

As clearly shown in FIG. 3, which is the case of a vertical oscillation of the surface of the both baths of 8 mm, level of particle contamination on a wafer is confirmed not to have been decreased at all even at the speeds lower than 40 mm/sec from those at the higher speeds.

In Experiments from (1) through (3), the aqueous solution of HF in the HF bath was constantly circulated through a filter to regulate the particle density of the solution less than a constant value of 1 particle/ml of the liquid and the tests were started when the particle density was stabilized to be a constant value less than 1 particle/ml. The measurement of the particle density in the liquid was carried out with Liquid Particle Counter KL-22 (made by Rion Co.).

The findings from the above mentioned three experiments show that, in order to reduce a particle pollution level to be lower than 120 particles per a circle of 200 mm in diameter of the surface of a wafer, a taken-in-or-out speed is required to be regulated under 50 mm/sec, preferably under 40 mm/sec or more preferably under 20 mm/sec, while a vertical oscillation of the liquid surface each of an HF bath and a deionized water bath is at the same time required to be regulated under 4 mm, preferably under 2 mm or more preferably under 1 mm.

All these requirements are imagined to be raised from the cause calling for less disturbance of the contour of the interface between the surfaces of a wafer and the surface of the liquid each of the baths so as to realize less particle pollution on the surface of a wafer in an HF cleaning.

From a view point of working efficiency, a taken-in-or-out speed of a wafer is preferably more than 1 mm/sec, or more preferably more than 5 mm/sec.

A concentration of HF of 0.5% in the HF aqueous solution was generally used in the above mentioned experiments, but there is no limitation of the HF concentration of the HF aqueous solution as far as HF cleaning remains effective. Generally an effective concentration is selected in the range from 0.1% to 10% with respect to HF content, but it may fall outside of the range. In the above experiments silicon wafers of a common p-type are used, but n-type silicon wafers can be cleaned with the same effectiveness on the conditions according to the present invention. The three minutes as the dipping duration was selected in the above experiments, but there is no special dipping duration in the HF cleaning method according to the present invention.

As described above, great decrease is practically realized in particle contamination level on the surface of a wafer as cleaned in HF cleaning according to the present invention and thereby device production yield may be increased due to elimination of a trouble in the semiconductor device fabrication process.

What is claimed is:

1. A method of cleaning a silicon wafer which comprises immersing the silicon wafer in a HF bath, followed by immersing the silicon wafer in a deionized water bath, wherein the silicon wafer is lowered into and lifted out of each of the baths along a direction which is substantially vertical with respect to a surface of each bath at a rate of from 1 mm/sec to 50 mm/sec, and wherein a vertical oscillation of the surface of each bath is in the range of less than 4 mm throughout said cleaning.

2. A method of cleaning a silicon wafer according to claim 1, wherein the silicon wafer is lowered into and lifted out of each bath at a rate of from 1 mm/sec to 40 mm/sec.

3. A method of cleaning a silicon wafer according to claim 2, wherein the vertical oscillation of the surface of each bath is in the range of less than 2 mm.

4. A method of cleaning a silicon wafer according to claim 2, wherein the vertical oscillation of the surface of each bath is the range of less than 1 mm.

5. A method of cleaning a silicon wafer according to claim 1, wherein the silicon wafer is lowered into and lifted out of each bath at a rate of from 5 mm/sec to 2 mm/sec.

6. A method of cleaning a silicon wafer according to claim 5, wherein the vertical oscillation of the surface of each bath is in the range of less than 2 mm.

7. A method of cleaning a silicon wafer according to claim 5, wherein the vertical oscillation of the surface of each bath is in the range of less than 1 mm.

8. A method of cleaning a silicon wafer according to claim 1, wherein the vertical oscillation of the surface of each bath is in the range of less than 2 mm.

9. A method of cleaning a silicon wafer according to claim 1, wherein the vertical oscillation of the surface of each bath is in the range of less than 1 mm.

* * * * *